(12) United States Patent
Ahec et al.

(10) Patent No.: US 11,846,688 B2
(45) Date of Patent: Dec. 19, 2023

(54) OPERATING STATE MONITORING DEVICE FOR MONITORING A CONNECTING CABLE AND OPERATING STATE CONTROLLING METHOD FOR MONITORING AN OPERATING STATE OF A CONDUCTING CONNECTING CABLE

(71) Applicant: Mahle International GmbH, Stuttgart (DE)

(72) Inventors: Ziga Ahec, Grosuplje (SI); Gregor Babic, Videm-Dobrepolje (SI); Peter Bozic, Rence (SI); Janez Smid, Ljubljana (SI); Rok Vrtovec, Sempas (SI)

(73) Assignee: Mahle International GmbH

( * ) Notice: Subject to any disclaimer, the term of this patent is extended or adjusted under 35 U.S.C. 154(b) by 0 days.

(21) Appl. No.: 17/520,618

(22) Filed: Nov. 5, 2021

(65) Prior Publication Data

US 2022/0146602 A1 May 12, 2022

(30) Foreign Application Priority Data

Nov. 6, 2020 (EP) .................................... 20206139

(51) Int. Cl.
*G01R 33/07* (2006.01)
(52) U.S. Cl.
CPC .................................. *G01R 33/07* (2013.01)
(58) Field of Classification Search
CPC .... G01R 33/07; G01R 15/207; G01R 15/202; G01R 31/58
See application file for complete search history.

(56) References Cited

U.S. PATENT DOCUMENTS

| 2006/0255793 | A1* | 11/2006 | Montreuil | ............ | G01R 15/207 324/117 R |
| 2010/0090684 | A1 | 4/2010 | Chen et al. | | |
| 2010/0238020 | A1* | 9/2010 | Pellen | .................... | H01B 7/324 340/533 |
| 2014/0176123 | A1* | 6/2014 | Okumura | ............. | G01R 15/202 324/127 |

(Continued)

FOREIGN PATENT DOCUMENTS

| DE | 102014223234 B3 | 3/2016 |
| DE | 102016210970 A1 | 12/2017 |

OTHER PUBLICATIONS

English abstract for DE-102014223234.
English abstract for DE-102016210970.
European Search Report for EP-20206139, dated Apr. 20, 2021.

*Primary Examiner* — Alvaro E Fortich
(74) *Attorney, Agent, or Firm* — Fishman Stewart PLLC

(57) ABSTRACT

An operating state monitoring device for monitoring a connecting cable, the device may include a connecting cable and at least two Hall sensors. The connecting cable may have at least two electroconductive conductors that extend along a longitudinal central axis, and through each of the conductors current flows or currant can flow by forming a magnetic field. The at least two Hall sensors may be configured to detect magnetic fields and output measuring signals based on detected magnetic fields. The device may have a number of Hall sensors that is identical to the number of conductions. A single Hall sensor may be arranged proximate each conductor via direct contract or indirect contact.

20 Claims, 12 Drawing Sheets

(56) References Cited

U.S. PATENT DOCUMENTS

2014/0266171 A1* 9/2014 Mosser ............... G01R 22/061
 324/228
2014/0292309 A1 10/2014 Kurashima et al.
2018/0088159 A1* 3/2018 Heintzelman .......... G01R 21/08
2018/0188293 A1 7/2018 Polley et al.

* cited by examiner

OPERATING STATE MONITORING DEVICE FOR MONITORING A CONNECTING CABLE AND OPERATING STATE CONTROLLING METHOD FOR MONITORING AN OPERATING STATE OF A CONDUCTING CONNECTING CABLE

CROSS-REFERENCE TO RELATED APPLICATION

This application claims priority to European Application No. EP 20206139.6 filed on Nov. 6, 2020, the contents of which are hereby incorporated by reference in its entirety.

TECHNICAL FIELD

The invention relates to an operating state monitoring device for monitoring an operating state of a conducting connecting cable according to the preamble of claim 1. The invention moreover relates to an operating state monitoring method for monitoring an operating state of a conducting connecting cable.

BACKGROUND

Operating state monitoring devices of this type are known, for example, from documents US 2010/0090684 A1, US 2014/0292309 A1, and US 2018/0088159 A1. A disadvantage of these operating state monitoring devices is that a plurality of sensors and/or a plurality of ferromagnetic bodies are required for monitoring an operating state of a connecting cable, which optionally consists of several electroconductive conductors for the energy transfer, wherein said ferromagnetic bodies engage around the respective connecting cable or optionally the respective conductors of the connecting cable virtually completely on the circumferential side. For example, these operating state monitoring devices are thus of relatively large construction and bulky, as a result of which it is relatively difficult to integrate them into existing electric drive concepts for electric vehicles.

The object of the invention is to propose an improved or at least another embodiment of an operating state monitoring device. An attempt is to in particular be made to provide an operating state monitoring device, which is of relatively small construction, i.e. compact.

In the case of the present invention, this object is solved in particular by the subject matter of the independent claims. Advantageous embodiments are subject matter of the dependent claims and of the description.

SUMMARY

The basic idea of the invention is to only assign a single Hall sensor and/or a piece of ferromagnetic body to each conductor of a connecting cable, which is to be monitored.

For this purpose, an operating state monitoring device for monitoring an operating state of a connecting cable for the energy transfer is proposed, which has a corresponding connecting cable for the energy transfer. To be able to transfer energy, the connecting cable has exactly two or at least two, thus in particular also three, four, or more electroconductive conductors, which each extend along a longitudinal central axis and through each of which current flows or current can flow thus forming a magnetic field. Current can or current does thereby flow through the one conductor in a positive current direction. Current can or current does flow through the other conductors in a negative current direction. The conductors can each be electrically insulated, e.g. from one another and/or to the outside, by means of an insulation. On one end, the conductors can further be connected to a power source in particular a traction battery of a motor vehicle, and, on the other end, to an electric consumer, in particular an electric drive of a motor vehicle, and transfer energy, in order to thus contribute to the power supply of the electric consumer. The operating state monitoring device furthermore has exactly two or at least two separate Hall sensors, which are each formed to detect magnetic fields and to output measuring signals, which are based on these detected magnetic fields. It is essential that the operating state monitoring device has a number of Hall sensors, which is identical to the number of the conductors. A single Hall sensor is thereby arranged at a single respective conductor with direct or indirect contact or without contact, in particular at an air gap distance transversely to the respective longitudinal central axis of a respective conductor. Exactly one single Hall sensor is thus assigned to each conductor of the exactly two or at least two conductors of the connecting cable. The exactly two or at least two Hall sensors can advantageously be operated together such that an operating state of the connecting cable can be monitored. The design according to the invention of the operating state monitoring device has the advantage that relatively few sensors are required to monitor an operating state of a connecting cable. The proposed operating state monitoring device is thereby of relatively small construction and compact, and can be produced relatively cost-efficiently due to the comparatively small number of components.

The measuring signals output by the Hall sensors can preferably in each case be a measuring voltage, which is proportional to the amount of the magnetic flux density of the respective detected magnetic field. In the present case, said measuring voltage is measured in Volt [V] and the magnetic flux density is measured in Millitesla [mT].

The term "direct touching contact" can mean that the components physically touch each other. For example, they are supported on each other.

The term "indirect touching-free contact" can mean that the components are in contact via an intermediate element, but do not touch each other physically. For example, they are in magnetic contact with each other via a magnetic field. Or further, for example, an intermediate layer of air or a solid is arranged between the components so that the components can support each other via this intermediate layer.

An X-axis and a Y-axis, which is perpendicularly thereto, can advantageously be specified, which defined a common point of intersection. A Z-axis can further be defined, which is in each case orthogonal with respect to the X-axis and the Y-axis. As a whole, a cartesian coordinate system is thus spanned. The at least two conductors or the longitudinal central axes thereof, respectively can be aligned orthogonally at least in sections or completely with respect to the X-axis and/or the Y-axis, in particular in a cohesive common section of the connecting cable. They thus in each case advantageously run parallel to one another and in particular parallel to the Z-axis, in particular within said cohesive section of the connecting cable.

It is furthermore advantageously provided that exactly two or at least two or four or eight or any even number of conductors of the connecting cable are arranged so as to rotate around said point of intersection. Exactly two of these conductors are thereby advantageously always arranged diametrically opposite one another in pairs with respect to the point of intersection, i.e. so as to be located opposite one another on a common diameter of a circle. The conductors, which are arranged diametrically opposite one another in pairs, advantageously have complementary current directions to one another, i.e. the one conductor has the positive current direction and the other current conductor the negative current direction. It can obviously also be provided that these conductors have identical current directions. The conductors, which are arranged diametrically opposite one another in pairs can each be connected to one another by means of a curvature-free straight connecting line. The respective straight connecting line thereby advantageously in each case intersects conductor cross sectional surface of the respective conductors or the respective longitudinal central axes of the respective conductors and the point of intersection. It is essential that exactly two Hall sensors are in each case arranged or assigned directly on each straight connecting line or at least in a tolerance band transversely around each straight connecting line. This has the advantageous effect that exactly one single closest Hall sensor is assigned to each conductor.

Further advantageously, the two Hall sensors arranged on a straight connecting line can in each case be arranged in the direction of this straight connecting line between the point of intersection and a conductor of the two conductors, which are connected to one another by means of this straight connecting line. The one Hall sensor can be arranged, for example, on this side of the point of intersection or at the straight connecting line, while the other Hall sensor is arranged on the other side of the point of intersection on or at this straight connecting line. In the alternative, it is also conceivable that the two Hall sensors, which are arranged on a straight connecting line, are in each case arranged in the direction of this straight connecting line between the point of intersection and one conductor of the two conductors, which are connected to one another by this straight connecting line, wherein the one Hall sensor of these two Hall sensors is arranged on this side of the X-axis or of the Y-axis, and the other Hall sensor of these two Hall sensors is arranged on the other side of the X-axis or of the Y-axis. In a further alternative, it can be provided that the two Hall sensors, which are arranged on a straight connecting line, are arranged in the direction of this straight connecting line radially outside the point of intersection and one conductor of the two conductors, which are connected to one another by this straight connecting line.

Advantageously, a conductor-Hall sensor distance can be defined, which can be measured in the direction of a straight connecting line between at least one Hall sensor arranged on or at this straight connecting line, and one conductor of the two conductors, which are connected to one another by this straight connecting line. Advantageously, said conductor-Hall sensor distance is quantitatively smaller than a Hall sensor-Hall sensor distance, which can be measured in the direction of this straight connecting line between the two Hall sensors, which are arranged on or at this straight connecting line. This has the effect that the respective Hall sensors are arranged closer to the respective conductors than against one another. The respective Hall sensors are thus in each case spatially assigned to a single conductor. This has the advantage that the respective Hall sensor sees a comparatively high magnetic flux density of the respective assigned conductor, so that the measuring signal, which is output by the respective Hall sensor, at least predominantly or virtually exclusively represents the detected magnetic field of the respective assigned conductor.

Further advantageously, a conductor-Hall sensor distance, which is to be measured in the direction of a straight connecting line between at least one Hall sensor arranged on or at this straight connecting line and one conductor of the two conductors, which are connected to one another by this straight connecting line, can be quantitatively smaller than a Hall sensor-Hall sensor X-distance, which is to be measured in the direction of the X-axis between this at least one Hall sensor and an adjacent further Hall sensor, which is arranged on a further straight connecting line, which is directly adjacent with respect to this straight connecting line. It is attained thereby that the respective Hall sensors are arranged spatially closer to a respective conductor than at the respective Hall sensors, which are adjacent in the direction of the X-axis. It can thus advantageously be ensured that the measuring signal, which is output by the respective Hall sensor, at least predominantly or virtually exclusively represents the detected magnetic field of the respective assigned conductor.

Advantageously, a conductor-Hall sensor distance, which is to be measured in the direction of a straight connecting line between at least one Hall sensor arranged on or at this straight connecting line and one conductor of the two conductors, which are connected to one another by this straight connecting line, can be quantitatively smaller than a Hall sensor-Hall sensor Y-distance, which is to be measured in the direction of the Y-axis between this at least one Hall sensor and an adjacent further Hall sensor, which is arranged on a further straight connecting line, which is directly adjacent with respect to this straight connecting line. It is attained thereby that the respective Hall sensors are arranged spatially closer to a respective conductor than at the respective Hall sensors, which are adjacent in the direction of the Y-axis. It can thus advantageously be ensured that the measuring signal, which is output by the respective Hall sensor, at least predominantly or virtually exclusively represents the detected magnetic field of the respective assigned conductor.

Further advantageously, the Hall sensors arranged on a straight connecting line can in each case be aligned parallel with respect to this straight connecting line, so that the magnetic fields of these two conductors, which are connected to one another by this straight connecting line, flows orthogonally through each of them. The respective magnetic fields can thus be measured virtually without error.

It is conceivable that the Y-axis or the X-axis and a straight connecting line are congruent, i.e. parallel. Angles in the range of 0° to 90° can furthermore be spanned between each straight connecting line and the Y-axis or the X-axis, the angles are preferably 30° or 45°. Angles in the range of 0° to 90° can in each case be spanned between the straight connecting lines, the angles 22.5°, 45°, or 90° are preferred, however. It goes without saying that the person of skill in the art can also set other angles between the Y-axis or the X-axis and a straight connecting line, and other angles between the straight connecting lines. A periodic arrangement of the straight connecting lines can thus result, which makes it possible to embody the operating state monitoring device in a relatively compact manner.

Advantageously, each Hall sensor can have a magnetic field semiconductor measuring layer of semiconductor material for measuring magnetic fields. The magnetic field semiconductor measuring layers of those Hall sensors, which are arranged on a straight connecting line, are each aligned parallel to this straight connecting line. The magnetic fields of the two conductors arranged on this straight connecting line can thus flow orthogonally through these magnetic field semiconductor measuring layers.

It is further advantageous when said Hall sensors form a unipolar or bipolar analog Hall sensor, or are of the unipolar or bipolar analog Hall sensor type. Advantageously, bipolar analog Hall sensors can be used, thus enabling detecting change of the current direction in all conductors, respectively.

Further advantageously, a single separate ferromagnetic magnetic field bundling body can be assigned to each Hall sensor. These magnetic field bundling bodies each extend in a circumferential direction around a longitudinal central axis of a conductor assigned to the respective Hall sensor, namely only in sections and advantageously over maximally 25% of the circumference of a respective conductor. An air gap is thereby advantageously provided between a conductor and a magnetic field bundling body. Each magnetic field bundling body is in particular spatially assigned to a single conductor. This has the advantage that the ferromagnetic magnetic field bundling bodies do not extend completely around a respective conductor. The operating state monitoring device is thus relatively lightweight and compact.

Advantageously, each magnetic field bundling body can bundle or focus the magnetic field of a conductor, which is arranged on a straight connecting line, on a Hall sensor of this straight connecting line. In particular the measuring sensitivity of the respective Hall sensor can be improved thereby. In particular the respective sensitivity to interferences can be reduced.

Further advantageously, the magnetic field bundling bodies can each have or form two magnetic field bundling passage surfaces, through which at least one magnetic field flows orthogonally or angularly. Of these two magnetic field bundling passage surfaces, the one magnetic field bundling passage surface can in each case be aligned parallel with respect to a Hall sensor, in particular with respect to the magnetic field semiconductor measuring layer thereof, and can be arranged at a gap distance from this Hall sensor. The other magnetic field bundling passage surface can be aligned orthogonally with respect to this Hall sensor, in particular with respect to the magnetic field semiconductor measuring layer thereof.

Advantageously, the operating state monitoring device can be realized by or implemented on a printed circuit board, in particular a so-called PCB (=printed circuit board), on which the electrical circuit for processing output measuring signals can be designed. For this purpose, the printed circuit board can have a computing device (e.g. small microcontroller) for carrying out a measuring signal conditioning, an error state detection, and/or a measuring signal interference suppression. To be able to construct the operating state monitoring device in a relatively compact manner, it can further be provided that the Hall sensors and/or the magnetic field bundling bodies, which are assigned to a Hall sensor, are each arranged with contact at the printed circuit board. The Hall sensors can thereby advantageously be interconnected with the computing device, so that the output measuring signals can be provided at the computing unit. The printed circuit board or the computing device can further be connected to a control device of an electric consumer, in particular a control unit of an electric drive of a motor vehicle, so as to communicate therewith. The printed circuit board can extend inside between the conductors. In other words, the printed circuit board, the Hall sensors, and the magnetic field bundling bodies can be fenced in or bordered by conductors so as to rotate circumferentially. This results in a particularly compact implementation of an operating state monitoring device.

Advantageously, it can also be provided that said printed circuit board and the connecting cable are provided as integral structural unit. For example, the assembly of a corresponding connecting cable into the drive train of a motor vehicle can thus be accomplished relatively quickly.

The invention is based on the further idea of specifying a method for operating the above-described operating state monitoring device. For this purpose, a method for monitoring the operating state of a conducting connecting cable, which is referred to as operating state monitoring method, for the power supply is proposed. The operating state monitoring method can be used, for example, in the case of an electric consumer, in particular an electric drive of a motor vehicle. As part of the operating state monitoring method, it is provided to perform the following steps by means of a conducting connecting cable for the power supply and by means of an operating state monitoring device according to the preceding description. Detecting at least two operating states, which differ from one another, of a conducting connecting cable, in that the Hall sensors of the operating state monitoring device initially detect magnetic fields formed by the conductors of the connecting cable, through which current flows, and then output or provide measuring signals, which are in each case based on these detected magnetic fields. Furthermore the output or provided measuring signals are provided at a printed circuit board of the operating state monitoring device, in particular at a computing device of the printed circuit board. Furthermore, the measuring signals provided there are conditioned and/or interference-suppressed as part of a measuring signal conditioning operation and/or a measuring signal interference suppression operation, which can be carried out by means of the printed circuit board, in particular by means of the computing device. Furthermore, the conditioned and/or interference-suppressed measuring signals are subsequently evaluated with regard to an operating state of the connecting cable as part of an error state detection operation, which can be carried out by means of the printed circuit board, in particular by means of the computing device.

It is advantageous when a signal amplification and/or a signal linearization and/or a signal conversion of the measuring signals, which are provided at the printed circuit board, takes place as part of said measuring signal conditioning operation. The provided measuring signals can thus subsequently be processed and/or evaluated easier and quicker.

To free the provided or conditioned measuring signals from interference signals, which are caused, for example, by external magnetic interference fields, said measuring signal interference suppression operation can be carried out. It can be designed as differential measurement (difference measuring method) on the basis of the provided or conditioned measuring signals. Advantageously, the provided or conditioned measuring signals of two Hall sensors, which are arranged on a single straight connecting line, are used as part of the differential measurement. The difference measuring method can optionally also be carried out based on the provided or conditioned measuring signals of several pairs of Hall sensors, which are each arranged on a single straight connecting line, or, in the alternative, based on the provided or conditioned measuring signals of all Hall sensors. In any case, the following steps are performed as part of the differential measuring method by means of the printed circuit board or the computing device of the printed circuit board: First of all, conversion of the provided or conditioned measuring signals, namely in each case into an X-axes measuring signal portion, which is a function of the angle orientation of the respective Hall sensor with respect to the X-axis, the Y-axis, and the Z-axis, and which is oriented in the direction of the X-axis, and into a Y-axes measuring signal portion, which is a function of the angle orientation of the respective Hall sensor with respect to the X-axis, the Y-axis, and the Z-axis, and which is oriented in the direction of the Y-axis. An X-axis measuring signal portion and a Y-axis measuring signal portion are therefore available at the printed circuit board or the computing device of the printed circuit board for each provided or conditioned measuring signal, thus quasi for each Hall sensor. A Z-axis measuring signal portion can optionally also be determined for each measuring signal, thus quasi for each Hall sensor. The orientation of the X-axis, of the Y-axis, and of the Z-axis thereby advantageously depends on the above definition. When determining the X-axis measuring signal portions and the Y-axis measuring signal portions, the following trigonometric connections can optionally be used, $$B_{iXMess} = -B_{ix}*\cos\alpha - B_{STÖRX}*\cos\alpha,$$

$$B_{iYMess} = +B_{iY}*\sin\alpha + B_{STÖRY}*\sin\alpha, \text{ wherein}$$

$B_{iXMess}$ identifies provided or conditioned measuring signals of an i-th Hall sensor, $B_{iYMess}$ identifies provided or processed measuring signals of an i-th Hall sensor, $B_{ix}$ identifies an X-axis measuring signal portion, $B_{iY}$ identifies a Y-axis measuring signal portion, $B_{STÖRX}$ identifies an X-axis interference field portion, $B_{STÖRY}$ identifies a Y-axis interference field portion, and wherein i is a whole integer without zero.

Said measuring signals, measuring signal portions, and interference field portions are preferably each measuring voltages, which are proportional to the amount of the magnetic flux density. The angle $\alpha$ is advantageously spanned between each straight connecting line and the X-axis or the Y-axis, or between at least one Hall sensor and the X-axis or the Y-axis, or a magnetic field semiconductor measuring layer of a Hall sensor and the X-axis or the Y-axis. It can be between 0° to 90°, 0° to 45°, or 0° to 30°.

A difference between the X-axes measuring signal portions, which is identified as X-difference, and a difference between the Y-axes measuring signal portions, which is identified as Y-difference, of different, in particular two Hall sensors, which are directly adjacent in the direction of the X-axis or the Y-axis, is subsequently determined as part of the difference measuring method. For example by using the following connection:

$$B_{i+1XMESS} - B_{iXMESS} = (B_{iX} - B_{i+1X})*\cos\alpha,$$

$$B_{iYMESS} + B_{i+1YMESS} = (B_{iY}*B_{i+1Y})*\sin\alpha.$$

It is thus possible to successfully remove the components of the interference signal as long as its value can be assumed to be the same on all Hall sensors.

It is obviously also possible that instead of the described difference measuring method, different interference suppression methods are used for the measuring signal interference suppression operation.

Further advantageously, said error state detection operation can have the following steps, which can be performed by means of the printed circuit board or the computing device of the printed circuit board:
1) examination of the provided, conditioned, and/or interference-suppressed measuring signals as to
   a) whether they are quantitatively each greater than zero and are identical to one another or are arranged at least within a predetermined or predeterminable tolerance band, for example+/−5% around a predetermined or predeterminable measuring signal, or
   b) whether at least one measuring signal deviates significantly from the other measuring signals (thus deviates in a clear manner from the others), or
   c) whether the measuring signals are each quantitatively zero and are identical to one another or are arranged at least within a predetermined or predeterminable tolerance band, for example+/−5% around a predetermined or predeterminable measuring signal, as well as
2) evaluation of the operating state of the connecting cable, either
   as normal operating state in the event that, after step 1) a), the measuring signals are each quantitatively greater than zero and are identical to one another or are arranged at least within a predetermined or predeterminable tolerance band, or
   as an interference state, which deviates from the normal operating state, in the event that, after step 1) b), a measuring signal deviates significantly from the other measuring signals (thus deviates in a clear manner from the others), or
   as a failure state in the event that, after step 1) c), all measuring signals are each quantitatively zero and are identical to one another or are arranged at least within a predetermined or predeterminable tolerance band.

Said error state detection operation can furthermore be attained by means of said difference measuring method, wherein the following steps are performed:
1) carrying out the difference measuring method according to the preceding description, wherein X-differences and Y-differences are obtained,
2) examining the obtained X-differences and Y-differences as to
   a) whether they are each quantitatively smaller than a predetermined or predeterminable threshold value, or
   b) whether at least one X-difference or a Y-difference deviates significantly (thus in a clear manner) from the other X-differences or Y-differences, or whether at least an X-difference or a Y-difference is quantitatively identical or greater than a predetermined or predeterminable threshold value,
3) evaluation of the operating state of the connecting cable, either
   as normal operating state in the event that, after step 2) a), the X-differences and the Y-differences are each quantitatively smaller than a predetermined or predeterminable threshold value, or
   as an interference state, which deviates from the normal operating state, in the event that, after step 2) b), at least an X-difference or a Y-difference deviates significantly (thus in a clear manner) from the other X-differences or Y-differences or at least an X-difference or a Y-difference is quantitatively identical to or greater than a predetermined or predeterminable threshold value.

In summary, it should be noted: The present invention preferably relates to an operating state monitoring device for a connecting cable having electroconductive conductors for the power supply of an electric consumer, in particular of an electric drive of a motor vehicle. It is essential for the invention that the operating state monitoring device has Hall sensors, which are each assigned to a single conductor. According to the invention, operating states of the connecting cable are determined by means of a difference measuring method, as part of which difference values are formed and evaluated from measuring signals of directly adjacent Hall sensors.

Further important features and advantages of the invention follow from the subclaims, from the drawings, and from the corresponding figure description on the basis of the drawings.

It goes without saying that the above-mentioned features and the features, which will be described below, cannot only be used in the respective specified combination, but also in other combinations or alone, without leaving the scope of the present invention.

Preferred exemplary implementations of the invention are illustrated in the drawings and will be described in more detail in the following description, whereby identical reference numerals refer to identical or similar or functionally identical components.

BRIEF DESCRIPTION OF THE DRAWINGS

In each case schematically.

DETAILED DESCRIPTION

Figure 1:
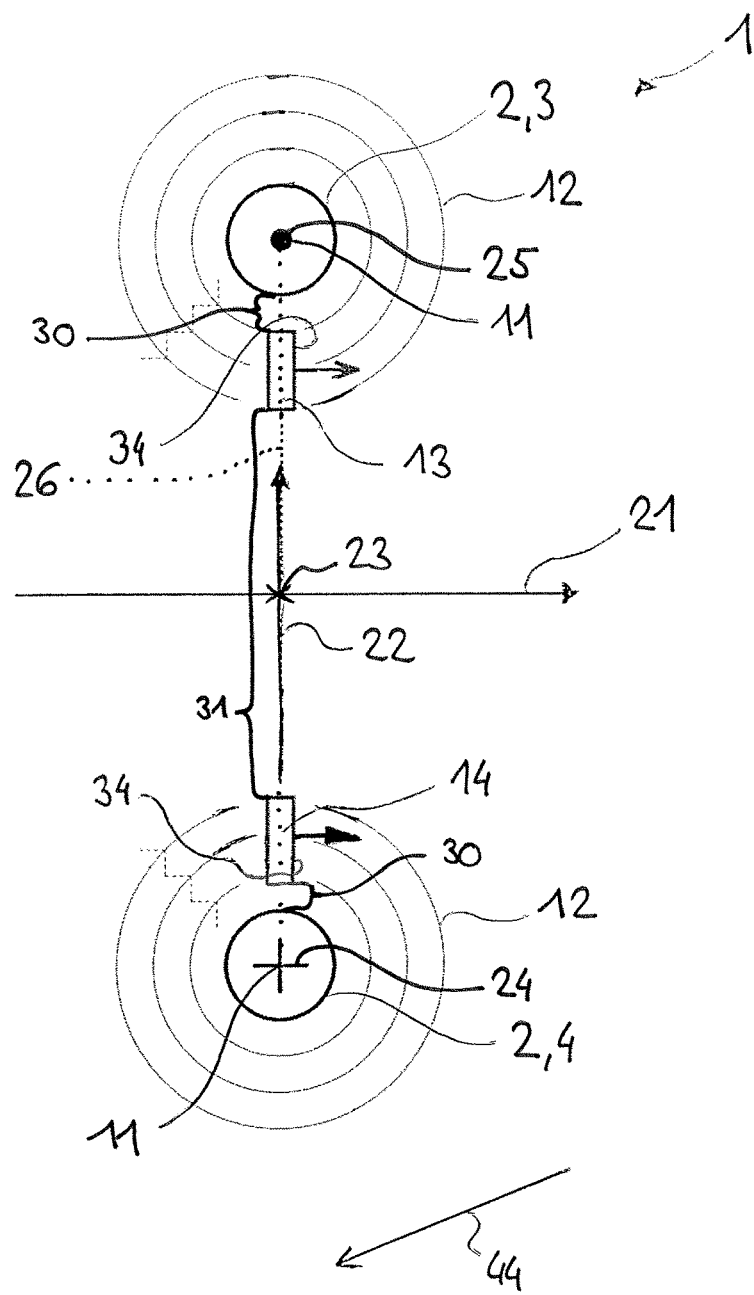
FIG. 1 shows a preferred exemplary implementation of an operating state monitoring device according to the invention comprising two conductors, through which current flows, and two Hall sensors, in a simplified view.

The drawings show an operating state monitoring device, which, as a whole, is identified with reference numeral 1, which is preferably used in the case of electric consumers, in particular in the case of electric drives of electric motor vehicles, for monitoring the operating state of the connecting cable 2, which is used there for the energy transfer. Functionally, the operating state monitoring device 1 is to detect a normal operating state of the connecting cable 2 and interference or failure states, which deviate from this state, so that the respective electric consumer can optionally be turned off, in order to prevent damages.

A highly simplified exemplary embodiment of an operating state monitoring device 1 according to the invention, which is of relatively small construction and lightweight, is suggested in FIG. 1. This operating state monitoring device 1 has a multicore connecting cable 2 of two cable-like electroconductive conductors 3, 4, through which current flows, and a number of Hall sensors, which is identical to the conductors 3, 4, namely two Hall sensors 13, 14. In an exemplary manner, the two conductors 3, 4 are each designed so as to be electrically insulated from one another, in order to prevent or to at least reduce the risk of short-circuits, when current flows through them. It is provided in an exemplary manner that current can flow through the one conductor 3 in negative current direction 25. The negative current direction 25 of this conductor 3 is suggested by means of a dot in FIG. 1, it quasi points out of the drawing plane in an exemplary manner. In a further exemplary manner, it is provided that current can flow through the other conductor 4 in the positive current direction 24. The positive current direction 24 of this conductor 4 is suggested by means of a cross or plus sign in FIG. 1, it quasi points into the drawing plane in an exemplary manner. The two conductors 3, 4, through which current can flow, each form a homogenous magnetic field 12, which characterizes the normal operating state of the connecting cable 2. The directions of the magnetic fields 12 are in each case suggested in FIG. 1 by means of arrows, according to the right-hand rule, which is used in practice. The two conductors 3, 4 each extend along a longitudinal central axis 11, which points out of the drawing plane in FIG. 1 and which is illustrated by a dot.

The two said Hall sensors 13, 14 serve the purpose of detecting the magnetic fields 12 and of outputting measuring signals, measuring voltages in the present case, which are based on these detected magnetic fields, 12. The magnetic fields 12 are each corrupted or disrupted or superimposed by an external magnetic interference field 44, which is advantageously homogenous at all points of the operating state monitoring device 1, so that the output measuring signals of the Hall sensors 13, 14 are also corrupted or disrupted or superimposed. It can easily be seen in FIG. 1 that the two Hall sensors 13, 14 are each arranged indirectly without contact and at an air gap distance at a respective single one of the two conductors 3, 4. This results in a spatial assignment, which makes it possible for the one Hall sensor 13 to at least predominantly or virtually exclusively detect the magnetic field 12 of the one conductor 3, through which current flows in negative current direction 25 in an exemplary manner, while the other Hall sensor 14 can at least predominantly or virtually exclusively detect the magnetic field 12 of the other conductor 4, through which current flows in the positive current direction 24 in an exemplary manner.

An X-axis 21 and a Y-axis 22, which is perpendicular with respect thereto, can furthermore be seen in FIG. 1. They define a common point of intersection 23. Said conductors 3, 4 are aligned orthogonally with respect to the X-axis 21 and the Y-axis 22, and are grouped so as to rotate around the point of intersection 23. The two conductors 3, 4, which have complementary current directions 24, 25, are thereby arranged so as to be located diametrically opposite one another in pairs with respect to the point of intersection 23, so that they can be connected to one another by means of a curvature-free straight connecting line 26, which is suggested by means of a dotted line in FIG. 1. This straight connecting line 26 thereby intersects the point of intersection 23 and in each case also the longitudinal central axes 11 of the conductors 3, 4. In an exemplary manner, the straight connecting line 26 is congruent and parallel with the Y-axis 22. In an exemplary manner, the two said Hall sensors 13, 14 are arranged directly on, quasi with contact on, this straight connecting line 26.

It can furthermore be seen in FIG. 1 that the two Hall sensors 13, 14 are in each case arranged in the direction of the straight connecting line 26 between the point of intersection 23 and one of the two conductors 3, 4. The one Hall sensor 13 is thereby arranged on the top side of the X-axis 21 or of the point of intersection 23 with respect to the straight connecting line 26, and the other Hall sensor 14 is arranged on the bottom side of the X-axis 21 or of the point of intersection 23 with respect to the straight connecting line 26.

Two conductor-Hall sensor distances 30 are furthermore entered in FIG. 1, which each identifies the distance, to be measured, for example, in millimeters [mm], in the direction of the straight connecting line 26 between a Hall sensor 13, 14 and the respective adjacent conductors 3, 4. In an exemplary manner, these conductors-Hall sensor distances 30 are quantitatively smaller than a Hall sensor-Hall sensor distance 31, which identifies the distance, to be measured, for example, in millimeters [mm], in the direction of the straight connecting line 26 between the two Hall sensors 13, 14. The respective Hall sensors 13, 14 are thus always arranged closer to the respective conductors 3, 4 than against one another. FIG. 1 furthermore shows that the two Hall sensors 13, 14, which are arranged on the straight connecting line 26, each have a magnetic field semiconductor measuring layer 34, which are aligned parallel with respect to the straight connecting line 26. The magnetic field 12 of the respective assigned conductor 3, 4, but also the magnetic field 12 of the other remote conductor 3, 4 can thus in each case flow through them orthogonally, Hall sensor arrows, which suggest the direction of the incident magnetic field 12 and which are orthogonal to the respective magnetic field semiconductor measuring layers 34, are in each case also entered at the Hall sensors 13, 14 in FIG. 1.

Figure 2:
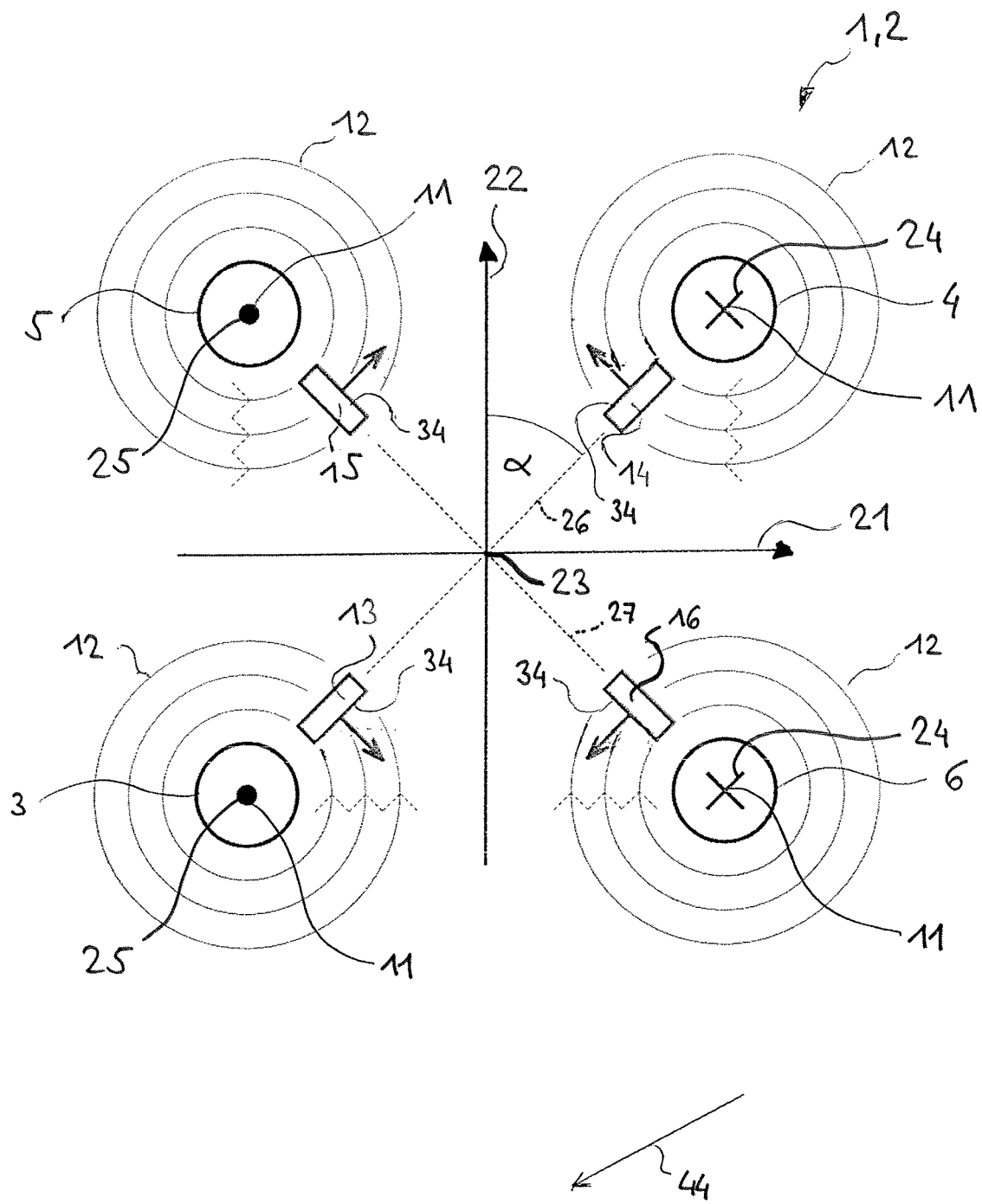
FIG. 2 shows a preferred further exemplary implementation of an operating state monitoring device according to the invention, comprising four conductors, through which current flows, and four Hall sensors, in a simplified view.

In a simplified view, FIG. 2 shows a preferred further exemplary embodiment of an operating state monitoring device 1 according to the invention, comprising a multicore connecting cable 2, which, in contrast to the preceding exemplary embodiment, has four conductors 3, 4, 5, 6, through which current flows, and accordingly four Hall sensors 13, 14, 15, 16, which are arranged at these conductors 3, 4, 5, 6 at gap distance. A pair of these Hall sensors 13, 14, 15, 16, which is in each case located diametrically opposite one another in pairs with respect to the point of intersection 23, is arranged on a curvature-free straight connecting line 26, 27, which runs through the point of intersection 23 and a pair of conductors 3, 4, 5, 6. The two straight connecting lines 26, 27 are each tilted at an angle with respect to the X-axis 21 and with respect to the Y-axis 22. An angle α of 45° is spanned between a straight connecting line 26 and the Y-axis 22 in FIG. 2 in an exemplary manner.

Figure 3:
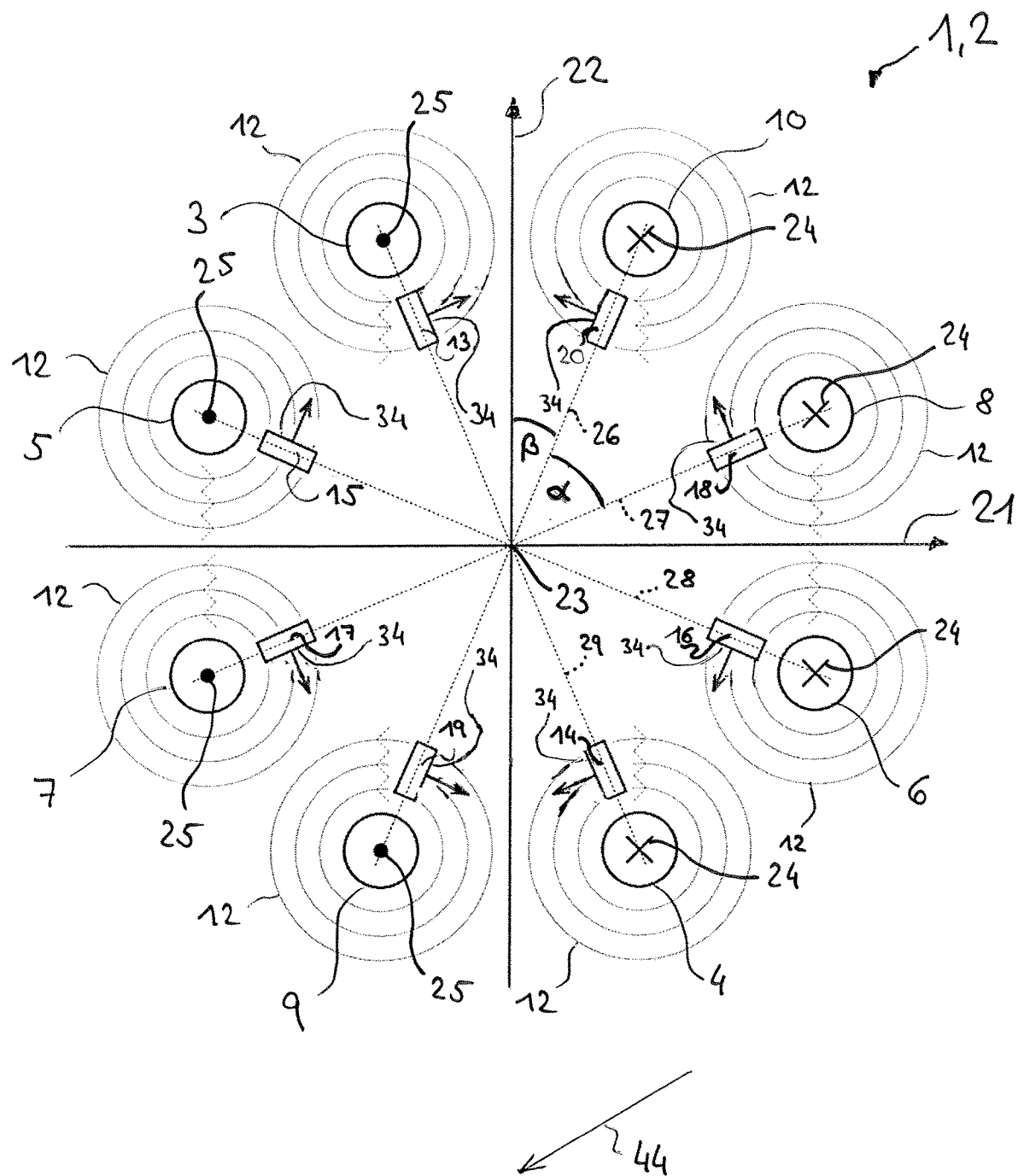
FIG. 3 shows a preferred further exemplary implementation of an operating state monitoring device according to the invention, now comprising eight conductors, through which current flows, and eight Hall sensors, in a simplified view.

In a simplified view, FIG. 3 shows a preferred further exemplary embodiment of an operating state monitoring device 1 according to the invention, now comprising eight conductors 3, 4, 5, 6, 7, 8, 9, 10, through which current flows, and an accordingly identical number of Hall sensors 13, 14, 15, 16, 17, 18, 19, 20, which are each arranged on a curvature-free straight connecting line 26, 27, 28, 29 in pairs and located diametrically opposite one another with respect to the point of intersection 23, as in the case of the preceding exemplary embodiments. The straight connecting lines 26, 27, 28, 29 each run through the point of intersection 23 and through a pair of conductors 3, 4, 5, 6, 7, 8, 9, 10. The straight connecting lines 26, 27, 28, 29 are each tilted at an angle with respect to the X-axis 21, with respect to the Y-axis 22, and in each case relative to one another. In FIG. 3, angles α of 45° are spanned in an exemplary manner between each individual straight connecting line 26, 27, 28, 29 and an adjacent straight connecting line 26, 27, 28, 29, and angles β of 22.5° are spanned between each straight connecting line 26, 27, 28, 29 and the X-axis 21 or the Y-axis 22. The Hall sensors 13, 14, 15, 16, 17, 18, 19, 20 each also have Hall sensor arrows, which are orthogonal on the respective magnetic field semiconductor measuring layers 34 and which suggest the direction of the respective incident magnetic field 12. The Hall sensors 13, 14, 15, 16, 17, 18, 19, 20 are thereby aligned such that the Hall sensor arrows on this side of the X-axis 21 point in the direction of the negative Y-axis 22, and in the direction of the positive Y-axis 22 on the other side of the X-axis 21. The Hall sensors 13, 14, 15, 16, 17, 18, 19, 20 are further aligned such that the Hall sensor arrows on this side of the Y-axis 22 point in the direction of the positive X-axis 21, and in the direction of the negative X-axis 21 on the other side of the Y-axis 22.

Figure 4:
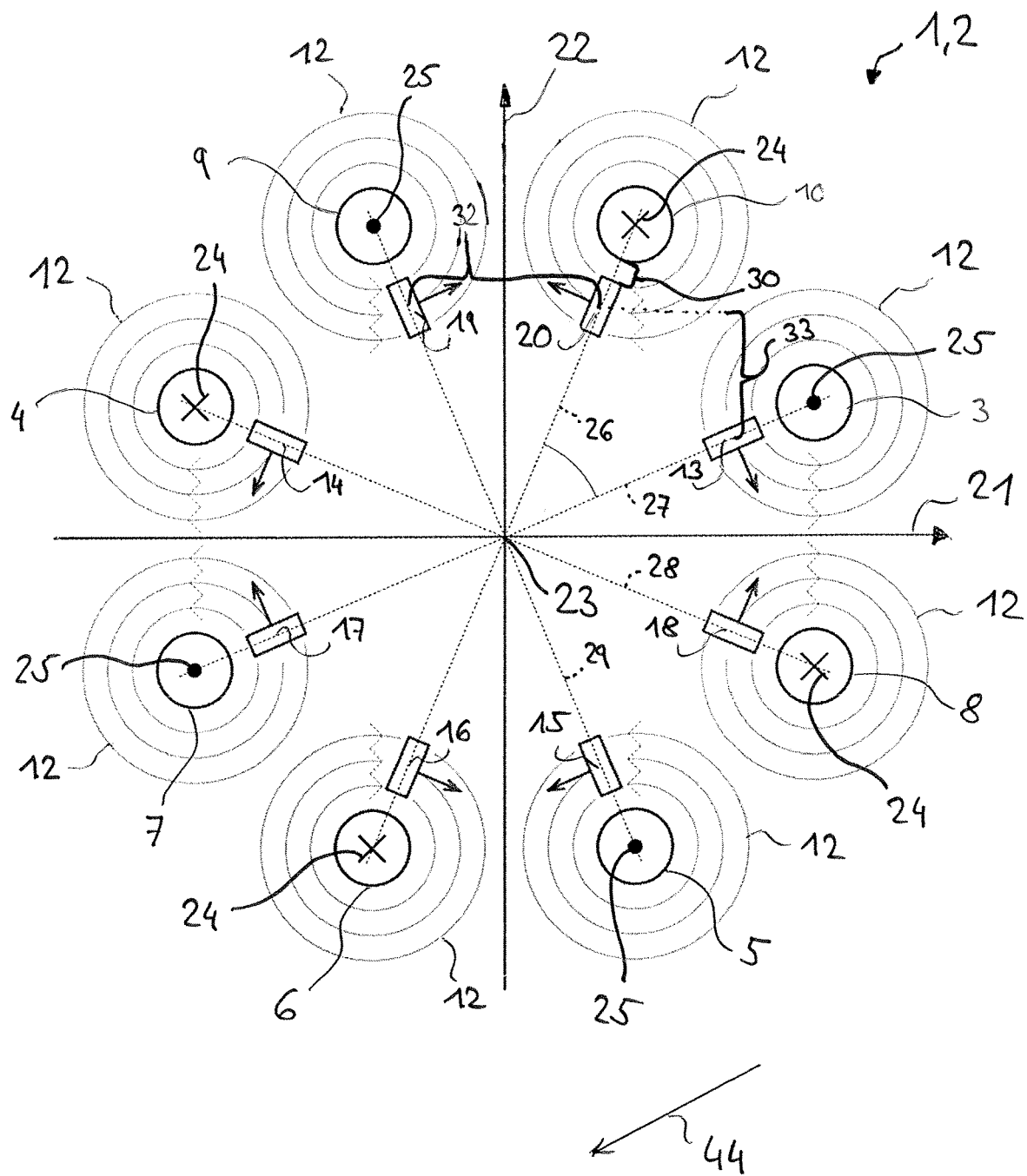
FIG. 4 shows a preferred further exemplary implementation of an operating state monitoring device according to the invention, comprising eight conductors, through which current flows, and eight Hall sensors, in a simplified view, but the current directions of the conductors are designed so as to differ from the preceding exemplary implementation.

In a simplified view, FIG. 4 shows a preferred further exemplary embodiment of an operating state monitoring device 1 according to the invention. As in the preceding exemplary embodiment, a connecting cable 2 is also given here, which has a total of eight conductors 3, 4, 5, 6, 7, 8, 9, 10, through which current flows, and eight Hall sensors 13, 14, 15, 16, 17, 18, 19, 20. In contrast to the preceding exemplary embodiment, a conductor-Hall sensor distance 30 is also entered in FIG. 4, which, in the present case, identifies the distance in the direction of the straight connecting line 26 between a Hall sensor 20, which is arranged on this straight connecting line 26, and the respective adjacent conductor 10. The conductor-Hall sensor distance 30 is quantitatively smaller than a Hall sensor-Hall sensor X-distance 32, measured in the direction of the X-axis 21, between this at least one Hall sensor 20 and a further Hall sensor 19, which is arranged adjacently in the direction of the X-axis 21 and which is arranged on an adjacent further straight connecting line 29. The conductor-Hall sensor distance 30 is further quantitatively smaller than a Hall sensor-Hall sensor Y-distance 33, measured in the direction of the Y-axis 22, between this at least one Hall sensor 20 and an adjacent further Hall sensor 13. The Hall sensors 13, 14, 15, 16, 17, 18, 19, 20 each also have Hall sensor arrows, which are orthogonal on the respective magnetic field semiconductor measuring layers 34. The Hall sensors 13, 14, 15, 16, 17, 18, 19, 20 are aligned such that the Hall sensor arrows have alternating orientations.

Figure 5:
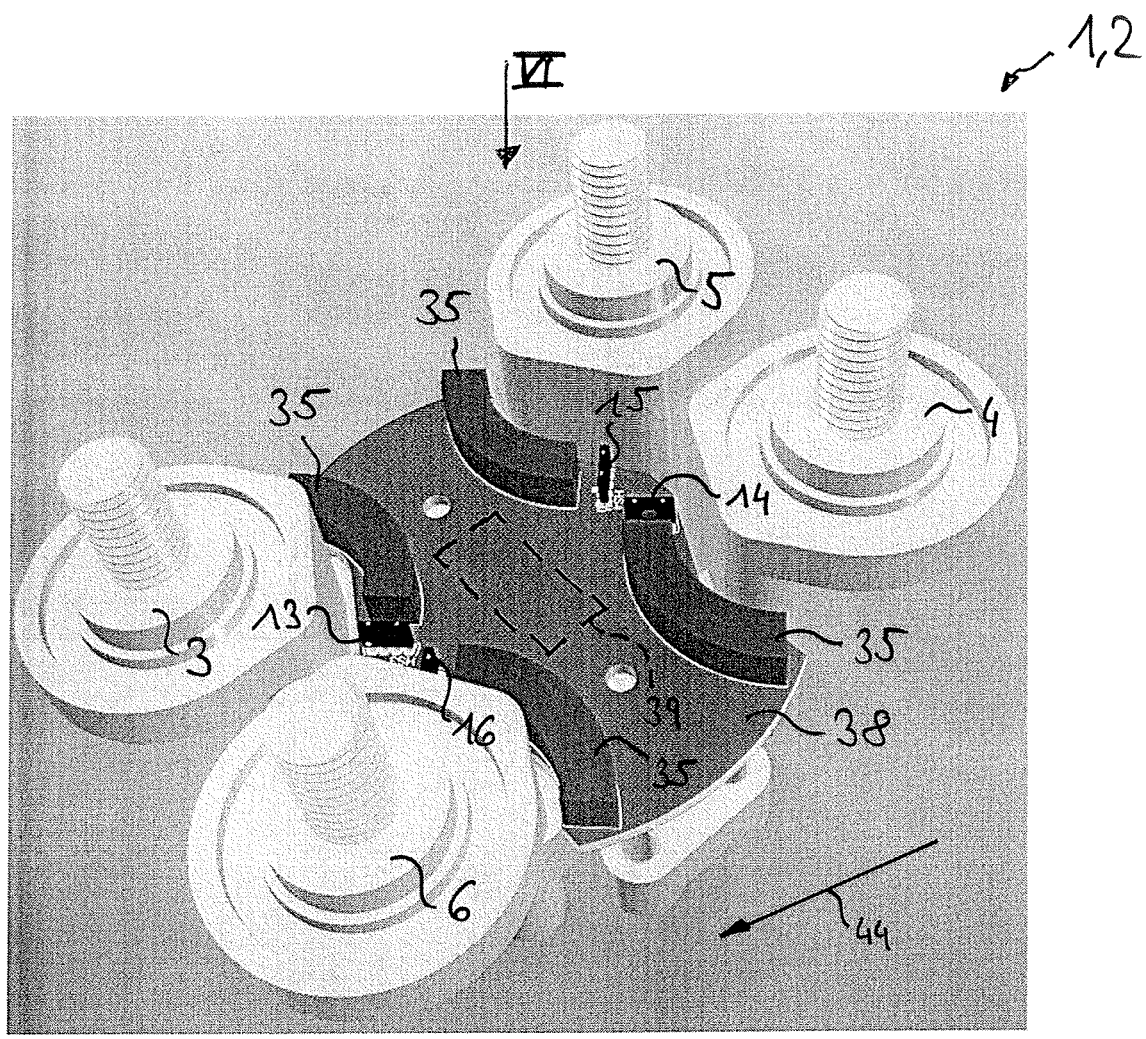
FIG. 5 shows a preferred further exemplary implementation of an operating state monitoring device according to the invention, comprising four conductors, through which current flows, and four Hall sensors, in a perspective view.

FIG. 5 shows a preferred further exemplary embodiment of an operating state monitoring device 1 according to the invention comprising four conductors 3, 4, 5, 6, through which current flows, of a connecting cable 2, and four Hall sensors 13, 14, 15, 16, in a perspective view. A separate ferromagnetic magnetic field bundling body 35, which each bundle the magnetic field 12 of a conductor 3, 4, 5, 6 on a Hall sensor 13, 14, 15, 16, is assigned to each Hall sensor 13, 14, 15, 16, in order to make the operating state monitoring device 1 as a whole more robust against interferences, in particular magnetic interference fields 44.

The operating state monitoring device 1 according to FIG. 5 is further equipped with a printed circuit board 38, which, as a whole, serves to process measuring signals of the Hall sensors 13, 14, 15, 16. A computing device 39, which is suggested by means of a small dashed box, for carrying out a measuring signal conditioning operation, a measuring signal interference suppression operation, and/or an error state detection operation, is arranged in an exemplary manner on the printed circuit board 38. The Hall sensors 13, 14, 15, 16 and the magnetic field bundling bodies 35 are further fixed on the printed circuit board 38. The printed circuit board 38 as a whole is designed to be relatively compact, so that it and the components arranged thereon can be arranged on the inside between the conductors 3, 4, 5, 6. The printed circuit board 38, the Hall sensors, 13, 14, 15, 16, and the magnetic field bundling bodies 35 are thus fenced in or bordered circumferentially by conductors 3, 4, 5, 6.

Figure 6:
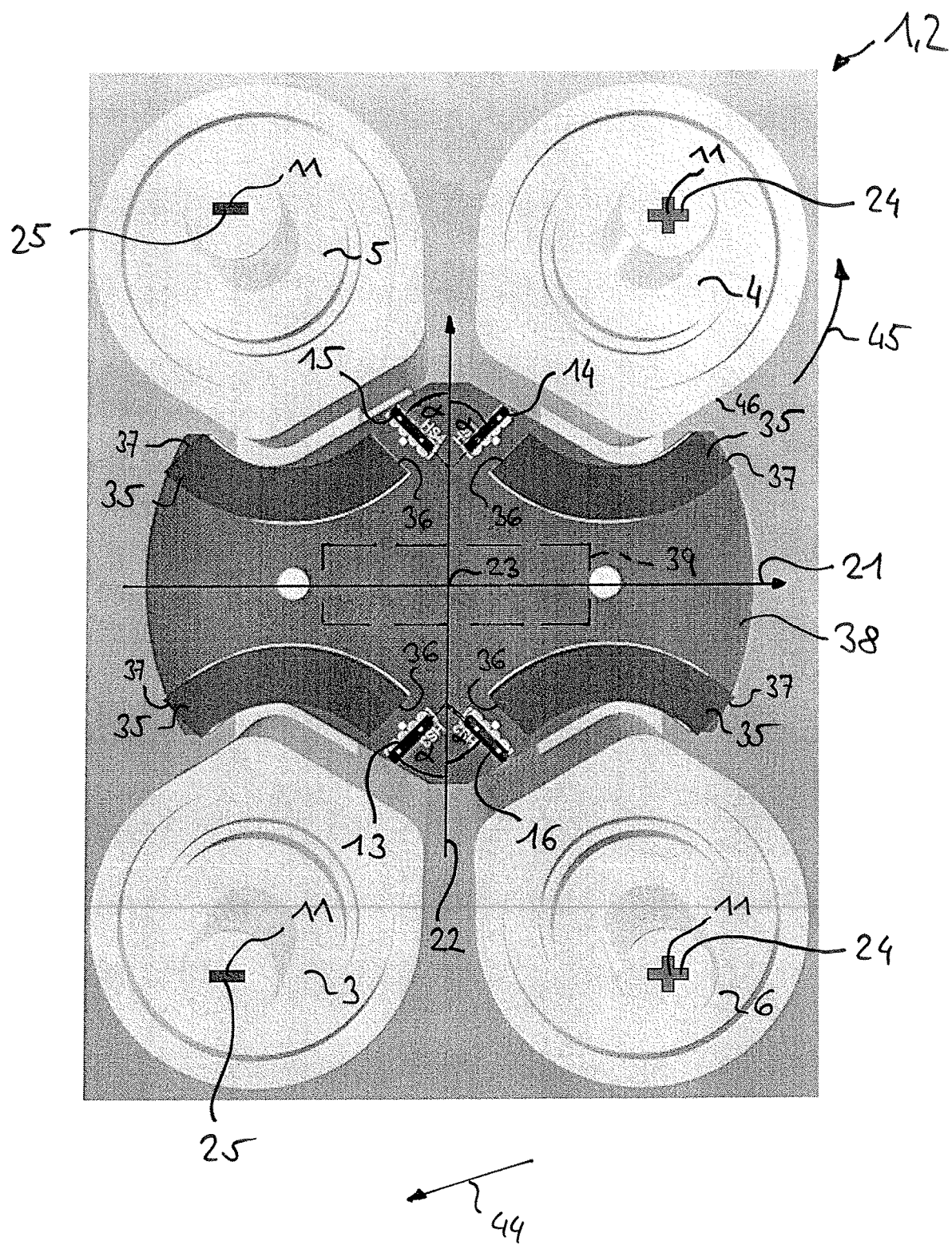
FIG. 6 shows the operating state monitoring device from FIG. 5 in a top view according to an arrow VI delineated in FIG. 5.

FIG. 6 shows the operating state monitoring device 1 from FIG. 5 in a top view according to an arrow VI delineated in FIG. 5. It can be seen that a coordinate system of an X-axis 21 and Y-axis 22, which intersect in a point of intersection 23 in the center of the printed circuit board 38, is also added in FIG. 6. The conductors 3, 4, 5, 6 each have longitudinal central axes 11, which are aligned orthogonally with respect to the X-axis 21 and Y-axis 22. A circumferential direction 45 is defined around each conductor 3, 4, 5, 6 or around each longitudinal central axis 11, respectively, whereby, in the present case, only a single circumferential direction 45 is suggested by a corresponding arrow. The magnetic field bundling bodies 35 arranged on the printed circuit board 38 are each embodied in a curved manner and each extend in a circumferential direction 45 around a longitudinal central axis 11 of a conductor 3, 4, 5, 6. In an exemplary manner, the magnetic field bundling bodies 35 each extend around maximally 25% of the circumference 46 of a respective conductor 3, 4, 5, 6. FIG. 6 further shows that each of the magnetic field bundling bodies 35 each has two magnetic field bundling passage surfaces 36, 37, through which a magnetic field 12 flows at an angle or orthogonally. The one magnetic field bundling passage surface 36 of the magnetic field bundling bodies 35 is thereby aligned parallel with respect to a Hall sensor 13, 14, 15, 16 or parallel to a magnetic field semiconductor measuring layer 34, respectively, of a Hall sensor 13, 14, 15, 16, and is arranged at an air gap distance to the respective Hall sensor 13, 14, 15, 16. The other magnetic field bundling passage surface 37 of the magnetic field bundling bodies 35 is in each case at a right angle with respect to the respective Hall sensor 13, 14, 15, 16 or at a right angle to the magnetic field semiconductor measuring layer 34 thereof, respectively. The present exemplary embodiment is further characterized in that an angle α of 45° is spanned between the Hall sensors 13, 14, 15, 16 or between the respective magnetic field semiconductor measuring layers 34 thereof, respectively, and the Y-axis 22. The operating state monitoring device 1 can further detect or evaluate, respectively, different operating states of the connecting cable 2, in that the printed circuit board 38 carries out an operating state monitoring method, as part of which for example a difference measuring method is carried out on the basis of output measuring signals of the Hall sensors 13, 14, 15, 16, in the case of which difference values are formed and evaluated from the output measuring signals of directly adjacent Hall sensors 13, 14, 15, 16.

Figure 7:
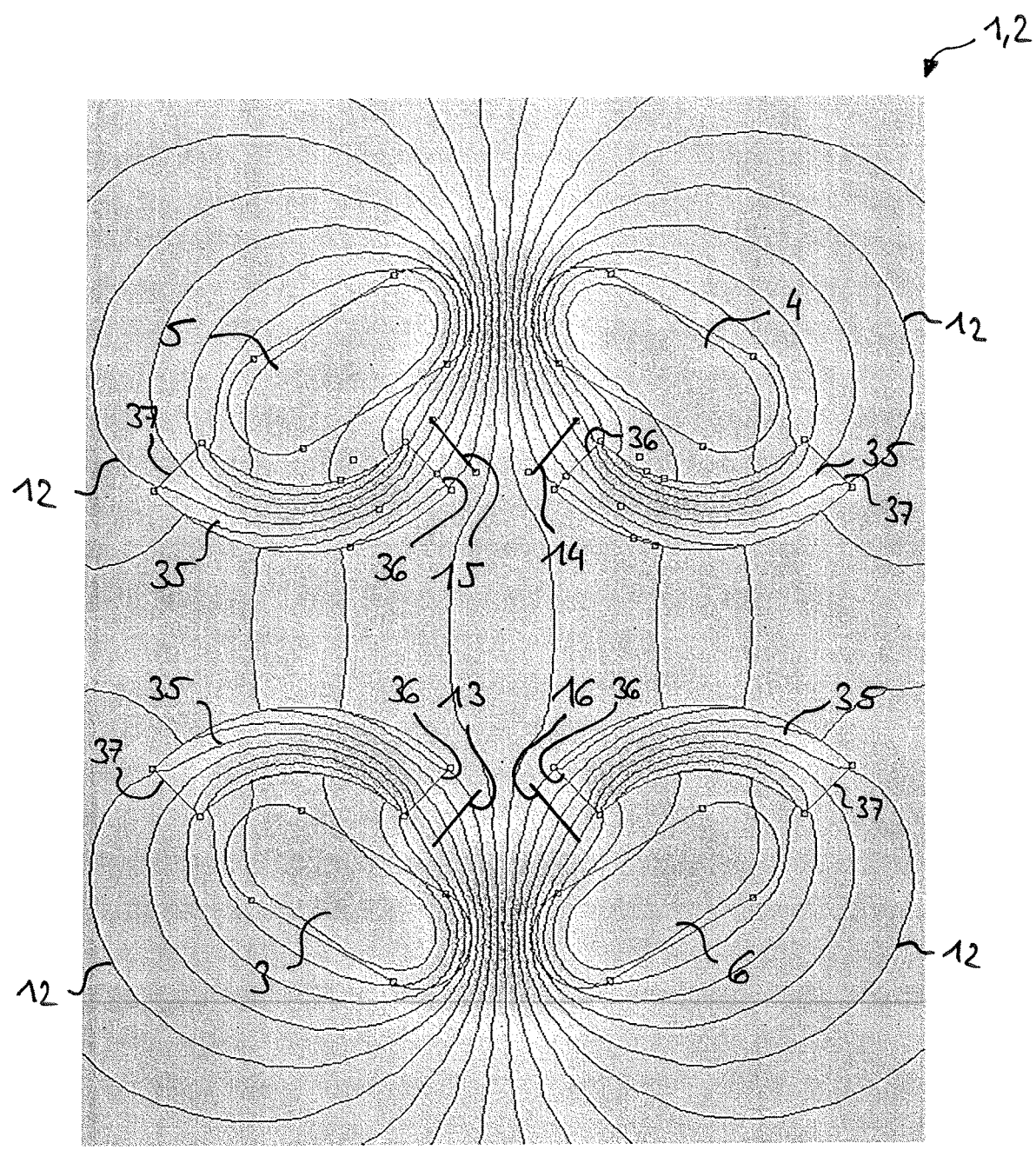
FIG. 7 shows a magnetic field line image of the operating state monitoring device from FIG. 5 in a top view according to an arrow VI delineated in FIG. 5, wherein all conductors are in a normal operating state.
Figure 8:
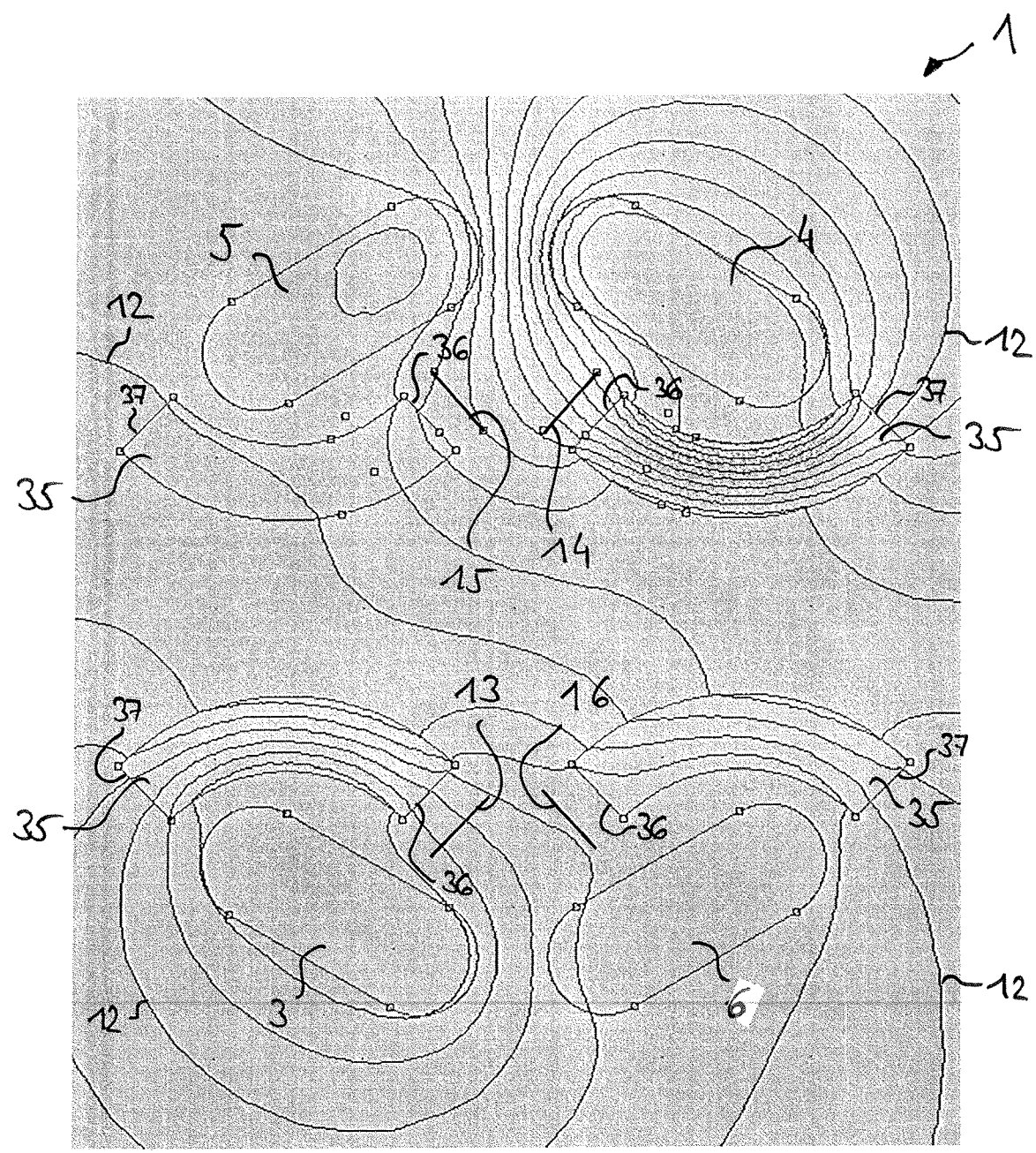
FIG. 8 shows a further magnetic field line image according to FIG. 7, wherein at least one conductor is in an interference state, which deviates from the normal operating state.

FIG. 7 shows a magnetic field line image of the operating state monitoring device 1 from FIGS. 5 and 6 in a top view according to an arrow VI delineated in FIG. 5, wherein all conductors 3, 4, 5, 6 are in an operating state of the connecting cable 2, which is identified as normal operating state. Current flows through the conductors 3, 4, 5, 6 in this case and they each form homogenous magnetic fields 12, which propagate in the manner illustrated in FIG. 7 by means of the operating state monitoring device 1. It can also be seen well that the ferromagnetic magnetic field bundling bodies 35 each bundle a magnetic field 12 of a conductor 3, 4, 5, 6 on a Hall sensor 13, 14, 15, 16. FIG. 8 illustrates an operating state of the connecting cable 2, which differs from the normal operating state and which is understood as interference state in the present case. The magnetic fields 12 suggested by means of magnetic field lines are now no longer homogenous, but are distorted.

Figure 9:
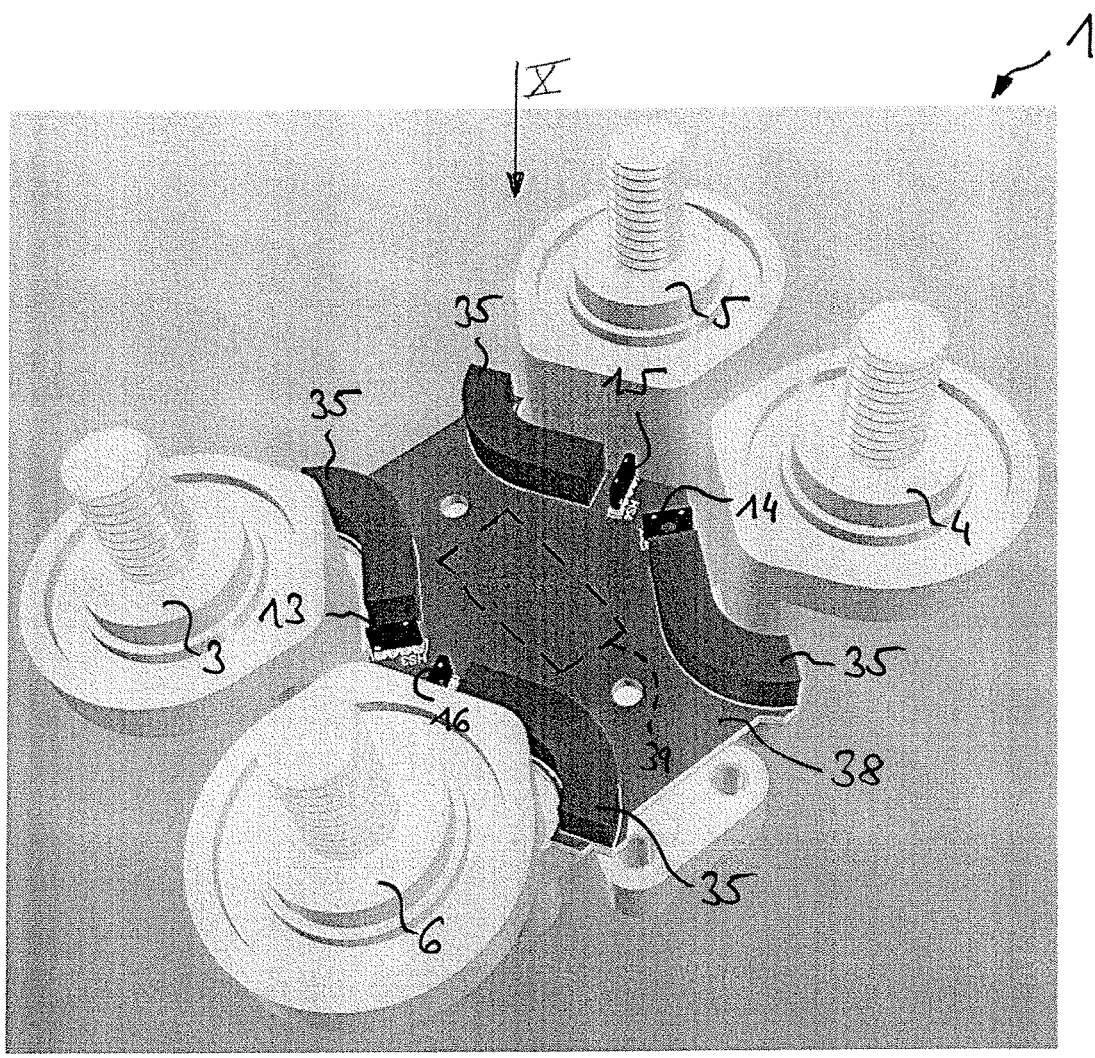
FIG. 9 shows a preferred further exemplary implementation of an operating state monitoring device according to the invention, comprising four conductors, through which current flows, and four Hall sensors, in a perspective view.
Figure 10:
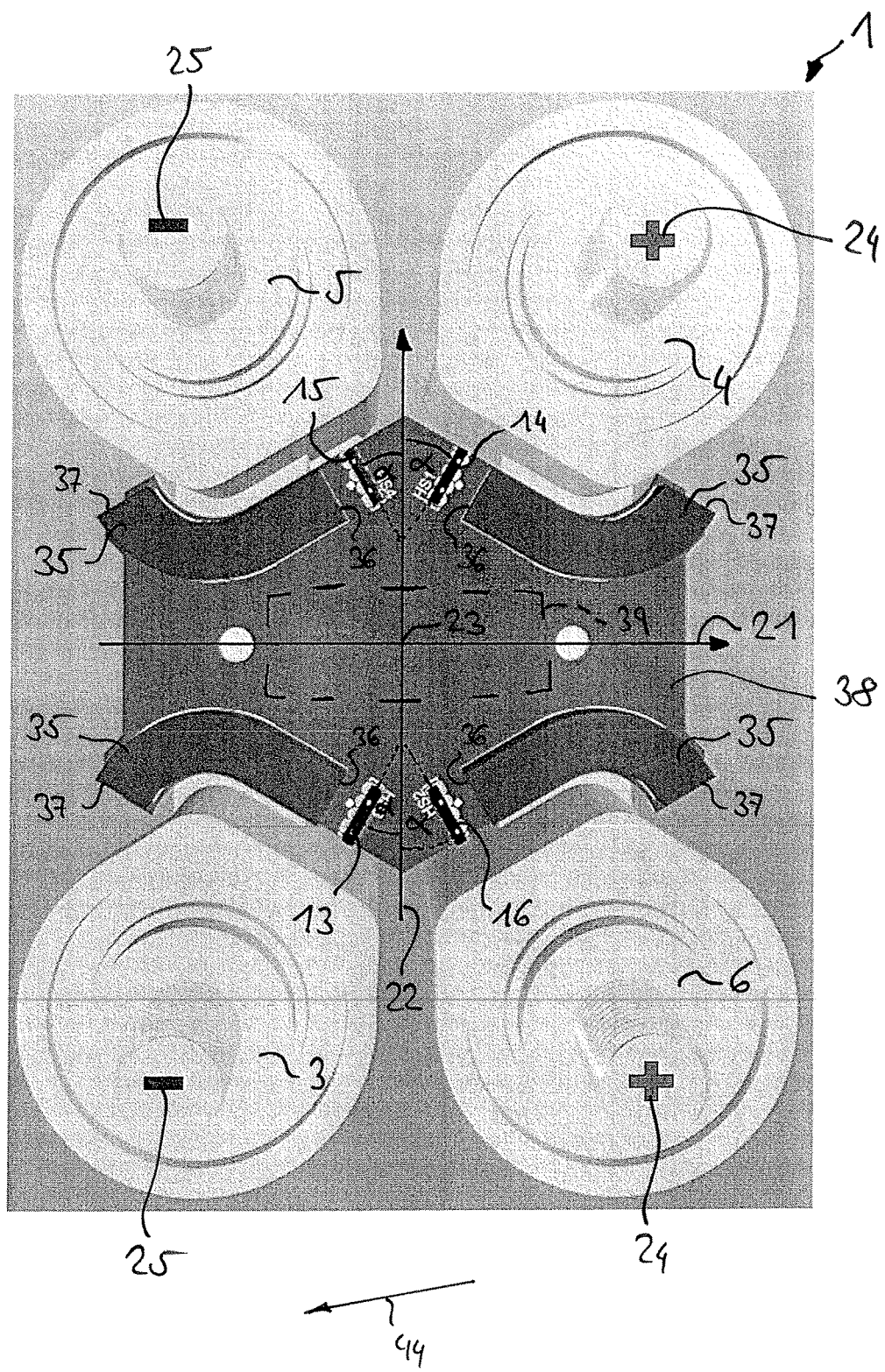
FIG. 10 shows the operating state monitoring device from FIG. 9 in a top view according to an arrow X delineated in FIG. 9.
Figure 11:
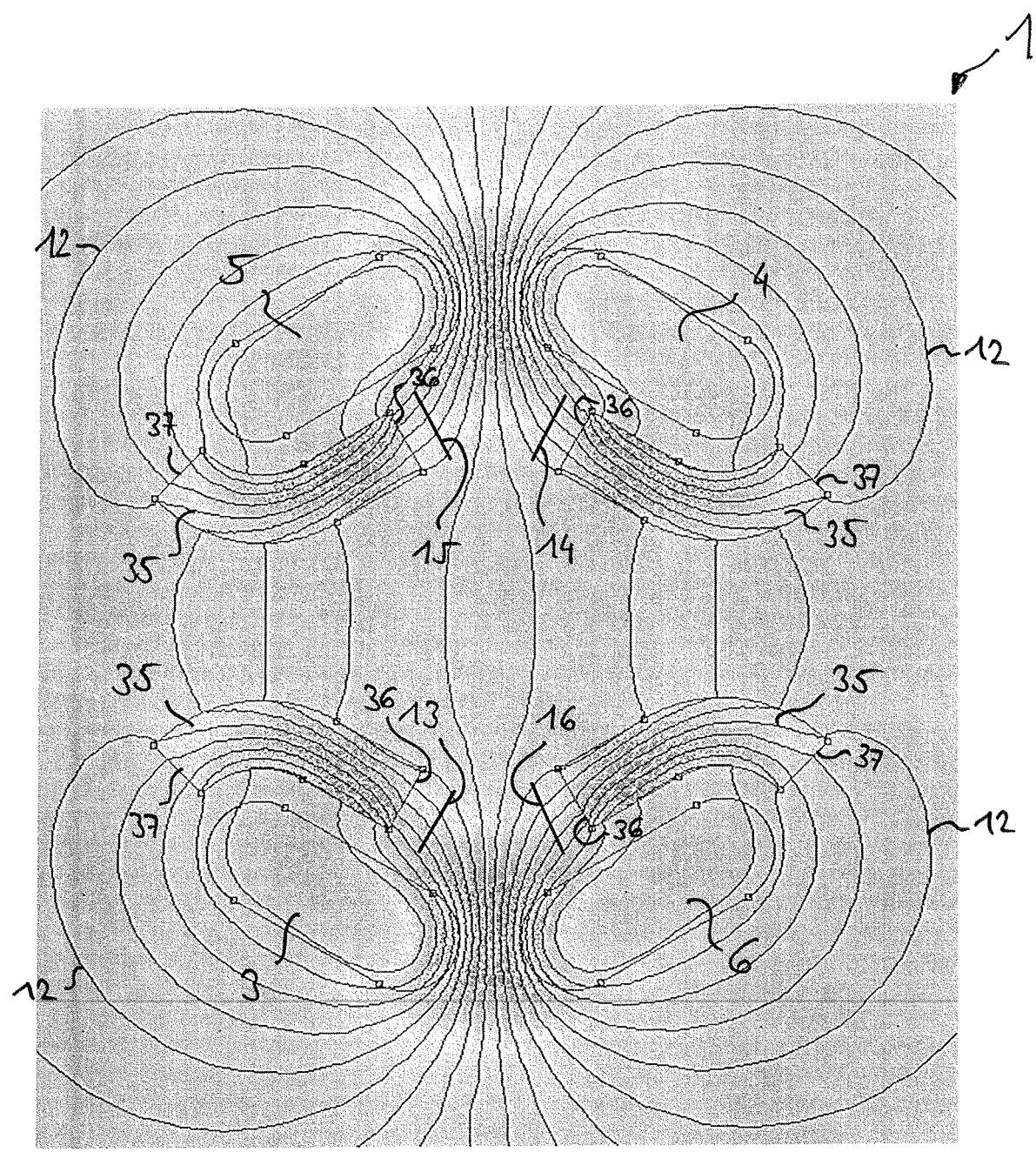
FIG. 11 shows a magnetic field line image of the operating state monitoring device from FIG. 9 in a top view according to an arrow X delineated in FIG. 9, wherein all conductors are in a normal operating state, and finally
Figure 12:
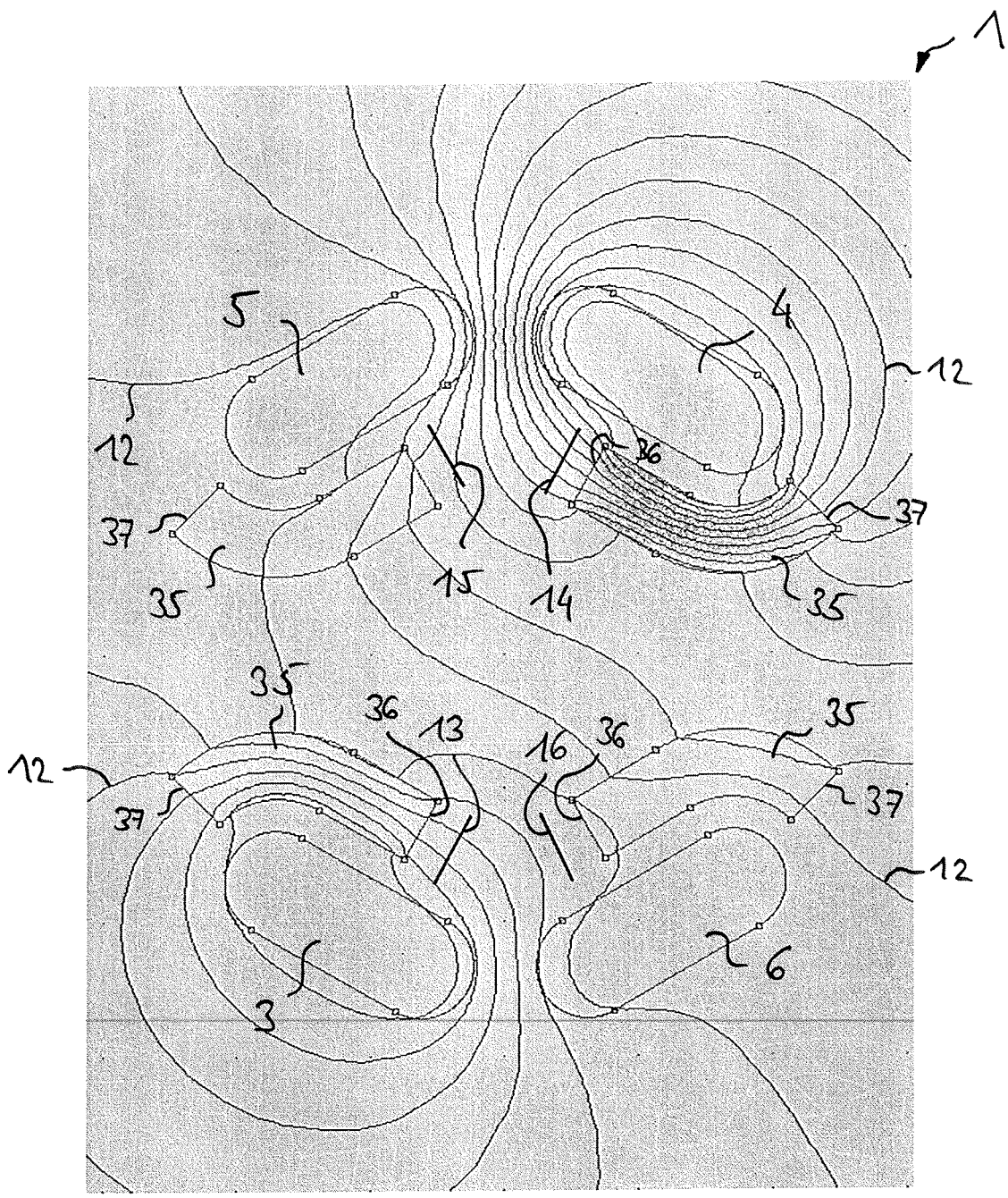
FIG. 12 shows a further magnetic field line image according to FIG. 11, wherein at least one conductor is in an interference state, which deviates from the normal operating state.

In a perspective view or in a top view, respectively, FIGS. 9 and 10 show a preferred further exemplary embodiment of an operating state monitoring device 1 according to the invention according to an arrow X, which is delineated in FIG. 9. Said operating state monitoring device is equipped with four conductors 3, 4, 5, 6 and four Hall sensors 13, 14, 15, 16. The present exemplary embodiment of the operating state monitoring device 1 differs from the exemplary embodiment of the operating state monitoring device 1 according to FIG. 9-12 only in that angles α of 30° are in each case spanned between the Hall sensors 13, 14, 15, 16 or between their respective magnetic field semiconductor measuring layers 34, respectively, and the Y-axis 22. FIG. 11, in turn, shows an operating state of the connecting cable 2, which is identified as normal operating state. FIG. 12 shows an interference state, in the case of which the magnetic fields 12 suggested by means of magnetic field lines are no longer homogenous, but distorted.

The invention claimed is:

1. An operating state monitoring device, comprising:
   a connecting cable including at least two electroconductive conductors that extend along a longitudinal central axis, and through each of the conductors current flows or current can flow by forming a magnetic field; and
   at least two Hall sensors configured to detect magnetic fields and output measuring signals based on detected magnetic fields;
   wherein the device has a number of Hall sensors that is identical to a number of the conductors; and
   a single Hall sensor of the at least two Hall sensors is arranged proximate each conductor via direct contact or indirect contact;
   wherein an X-axis and a Y-axis define a common point of intersection;
   the at least two conductors are aligned orthogonally with respect to the X-axis and the Y-axis;
   the at least two conductors are arranged to rotate around the point of intersection;
   the at least two conductors have complementary current directions and are arranged diametrically opposite one another with respect to the point of intersection, the at least two conductors are connected to one another by a curvature-free straight connecting line that intersects the longitudinal central axes and the point of intersection; and two Hall sensors are arranged proximate the straight connecting line.

2. The device according to claim 1, wherein the two Hall sensors are arranged in a direction of a straight connecting line between the point of intersection and a conductor of the two conductors.

3. The device according to claim 1, wherein a conductor-Hall sensor distance in the direction of a straight connecting line) between at least one Hall sensor arranged on the straight connecting line and one conductor of the two conductors which are connected to one another by the straight connecting line is smaller than a Hall sensor-Hall sensor distance in the direction of the straight connecting line between the two Hall sensors which are arranged on this straight connecting line.

4. The device according to claim 1, wherein a conductor-Hall sensor distance in the direction of a straight connecting line between at least one Hall sensor arranged on the straight connecting line and one conductor of the two conductors which are connected to one another by the straight connecting line is smaller than a Hall sensor-Hall sensor X-distance which is measured in a direction of the X-axis between the at least one Hall sensor and an adjacent further Hall sensor which is arranged on a further straight connecting line which is directly adjacent with respect to the straight connecting line.

5. The device according to claim 1, wherein a conductor-Hall sensor distance in the direction of a straight connecting line between at least one Hall sensor arranged on the straight connecting line and one conductor of the two conductors which are connected to one another by the straight connecting line is smaller than a Hall sensor-Hall sensor Y-distance which is measured in the direction of the Y-axis between the at least one Hall sensor and an adjacent further Hall sensor which is arranged on a further straight connecting line which is directly adjacent with respect to the straight connecting line.

6. The device according to claim 1, wherein the two Hall sensors arranged on a straight connecting line are aligned parallel with respect to the straight connecting line so that magnetic fields of the two conductors flow orthogonally through each.

7. The device according to claim 1, wherein:
each Hall sensor has a magnetic field semiconductor measuring layer; and
the magnetic fields of the two conductors arranged on a straight connecting line flow orthogonally through the magnetic field semiconductor measuring layers of the two Hall sensors which are arranged on a straight connecting line.

8. The device according to claim 1, wherein:
a separate ferromagnetic magnetic field bundling body is assigned to each Hall sensor; and
the magnetic field bundling bodies each extend in a circumferential direction around a longitudinal central axis of a conductor over maximally 25% of the circumference of a respective conductor.

9. The device according to claim 8, wherein each magnetic field bundling body focusses the magnetic field of a conductor arranged on a straight connecting line to a Hall sensor of the straight connecting line.

10. The device according to claim 8, wherein the magnetic field bundling bodies each have or form two magnetic field bundling passage surfaces through which one magnetic field flows orthogonally, one magnetic field bundling passage surface is aligned parallel with respect to a Hall sensor and is arranged at a gap distance from the Hall sensor, and the other magnetic field bundling passage surface is aligned orthogonally with respect to the Hall sensor.

11. The device according to claim 8, wherein the device has a printed circuit board for processing measuring signals of the Hall sensors, wherein the printed circuit board has a computing device for carrying out a measuring signal conditioning, an error state detection, and/or a measuring signal interference suppression.

12. The device according to claim 2, wherein one of the two Hall sensors is arranged on a side of the X-axis, and the other one of the two Hall sensors is arranged on a side of the Y-axis.

13. The device according to claim 2, wherein the two Hall sensors are arranged in the direction of the straight connecting line downstream on an outside from the point of intersection and one conductor of the two conductors.

14. The device according to claim 6, wherein an angle in a range of 0° to 45° is spanned between the straight connecting line and the Y-axis.

15. The device according to claim 6, wherein an angle in a range of 45° to 90° is spanned between the straight connecting line and the Y-axis.

16. The device according to claim 11, wherein the Hall sensors and the magnetic field bundling bodies are each arranged with contact at the printed circuit board; and
the printed circuit board is arranged radially on an inside in the direction of a straight connecting line between the point of intersection and the conductors so that the printed circuit board, the Hall sensors, and the magnetic field bundling bodies are fenced in or bordered by conductors to rotate circumferentially.

17. An operating state monitoring device, comprising:
a connecting cable including at least two electroconductive conductors that extend along a longitudinal central axis, and through each of the conductors current flows or current can flow by forming a magnetic field; and
at least two Hall sensors configured to detect magnetic fields and output measuring signals based on detected magnetic fields;
wherein the device has a number of Hall sensors that is identical to a number of the conductors;
a single Hall sensor of the at least two Hall sensors is arranged proximate each conductor via direct contact or indirect contact;
wherein each Hall sensor has a magnetic field semiconductor measuring layer; and
wherein the magnetic fields of the at least two conductors, which are arranged on a straight connecting line, flow orthogonally through the magnetic field semiconductor measuring layers of the at least two Hall sensors, which are arranged on a straight connecting line.

18. An operating state monitoring device, comprising:
a connecting cable including at least two electroconductive conductors that extend along a longitudinal central axis, and through each of the conductors current flows or current can flow by forming a magnetic field; and
at least two Hall sensors configured to detect magnetic fields and output measuring signals based on detected magnetic fields;
wherein the device has a number of Hall sensors that is identical to a number of the conductors;
a single Hall sensor of the at least two Hall sensors is arranged proximate each conductor via direct contact or indirect contact;
wherein a separate ferromagnetic magnetic field bundling body is assigned to each Hall sensor; and wherein the magnetic field bundling bodies each extend in a circumferential direction around a longitudinal central axis of a respective conductor of the at least two conductors over maximally 25% of the circumference of the respective conductor.

19. The device according to claim 18, wherein each magnetic field bundling body focusses the magnetic field of a conductor arranged on a straight connecting line to a Hall sensor of the straight connecting line.

20. The device according to claim 18, wherein the magnetic field bundling bodies each have or form two magnetic field bundling passage surfaces through which one magnetic field flows orthogonally, one magnetic field bundling passage surface is aligned parallel with respect to a Hall sensor and is arranged at a gap distance from the Hall sensor, and the other magnetic field bundling passage surface is aligned orthogonally with respect to the Hall sensor.

\* \* \* \* \*